United States Patent [19]

Stoltenberg

[11] Patent Number: 5,302,945
[45] Date of Patent: Apr. 12, 1994

[54] ELECTRIC APPLIANCE FAULT MONITOR AND INDICATOR

[75] Inventor: Kevin J. Stoltenberg, Clitherall, Minn.

[73] Assignee: Technimedics Corporation, Clitherall, Minn.

[21] Appl. No.: 934,599

[22] Filed: Aug. 24, 1992

[51] Int. Cl.5 .............................................. G08B 21/00
[52] U.S. Cl. .................................... 340/660; 340/659; 340/564; 340/648; 324/133; 256/10
[58] Field of Search ............... 340/564, 657, 658, 659, 340/660, 648; 256/10; 324/122, 133

[56] References Cited

U.S. PATENT DOCUMENTS

| 3,315,246 | 4/1967 | Huffman et al. |
| 3,531,790 | 9/1970 | Staley |
| 3,581,299 | 5/1971 | Schmit |
| 3,611,338 | 10/1971 | Kramer |
| 3,772,529 | 11/1973 | Boeing |
| 3,991,367 | 11/1976 | Chapman et al. |
| 4,171,523 | 10/1979 | Parkitny |
| 4,220,949 | 9/1980 | Pope et al. |
| 4,297,633 | 10/1981 | McCutchan et al. |
| 4,523,187 | 6/1985 | Begg |
| 4,558,310 | 12/1985 | McAllise ............................. 340/661 |
| 4,725,825 | 2/1988 | McKean ............................. 340/660 |
| 4,795,971 | 1/1989 | Murao |
| 5,015,944 | 5/1991 | Bubash ............................ 340/664 X |
| 5,057,814 | 10/1991 | Onan et al. |

Primary Examiner—Jeffery A. Hofsass
Attorney, Agent, or Firm—Haugen and Nilolai

[57] ABSTRACT

A monitor and indicating circuit for an electric appliance detects the absence of the energization voltage for the appliance exceeding a predetermined threshold and provides a brilliant flash from a xenon lamp which is visible from great distances. The circuitry is contained within a sealed housing and includes a self-contained battery supply and attachable to a fence post. The circuit employed is specifically designed to conserve battery power by controlling the flash frequency and the charging time for the storage capacitor used with the xenon flash tube.

16 Claims, 3 Drawing Sheets

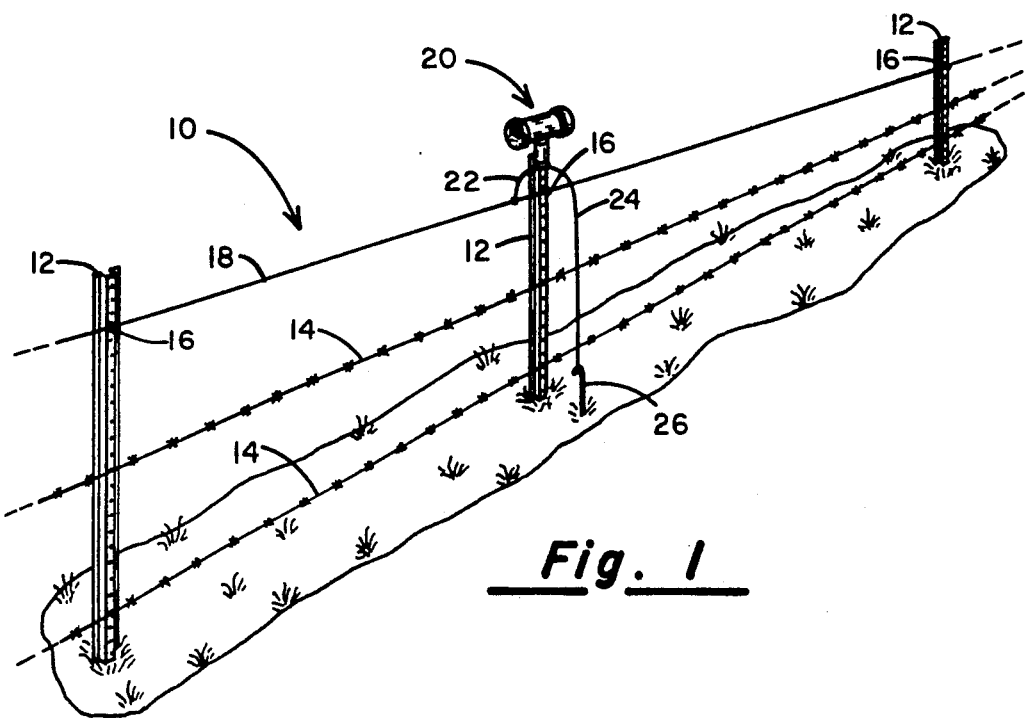
Fig. 1
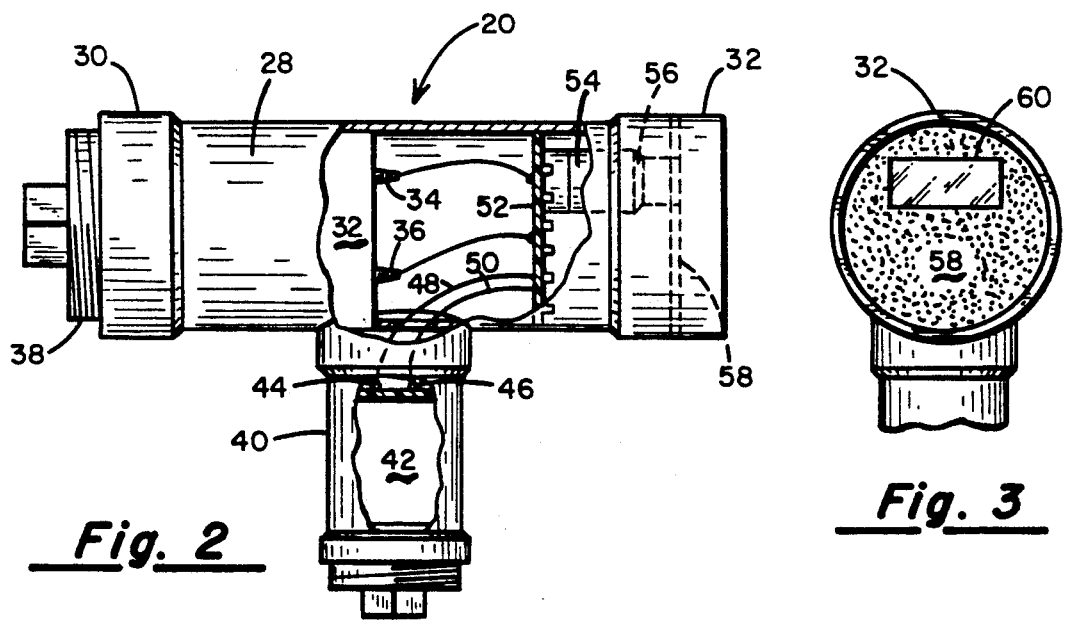
Fig. 2
Fig. 3

ELECTRIC APPLIANCE FAULT MONITOR AND INDICATOR

BACKGROUND OF THE INVENTION

I. Field of the Invention

This invention relates generally to signalling apparatus, and more particularly to a device attachable to an electric appliance for providing a visual signal to a farmer or rancher that the appliance is not properly operating, the signal being visible from great distances.

II. Discussion of the Prior Art

While the present invention finds many applications on a farm or ranch where various electrically operated devices are used and a fault condition must be signaled so that effective and prompt attention can be applied, it will be described as applied to use with electric fence systems. It is to be understood, however, that the device can find wide usage on a farm or ranch to signal failure of confinement barns ventilation systems, motor-driven pumps for irrigation and/or stock watering systems, etc. Electric fences have long been used to confine animals, such as horses, cattle, sheep and hogs. The principles of operation of such fences are well known. High voltage impulses of a predetermined duty cycle are applied from a fence generator to one or more fence wires which are strung between posts or insulators so as to define the perimeter of the field or pasture in which the animals are to be confined. When an animal brushes against the energized wire, a path to ground is established through the animal and an uncomfortable shock is delivered. The animals learn quickly that if they are to avoid being shocked, they may not touch the fence and, accordingly, they tend not to break through the fence to roam in undesired areas.

Conditions can arise that may cause the electric fence to malfunction. For example, a branch may fall from a tree and come to rest against the fence so as to create a short circuit to ground through the branch. Similarly, wet grass can grow up to a height where it, too, significantly decreases the amplitude of the voltage pulses traversing the fence line so that they may no longer deter the grazing animals from knocking the fence down or breaking through it. Malfunction can also occur if an animal such a deer breaks the electric fence wire. It is important when such conditions arise that the farmer or rancher be apprised of the malfunction so that corrective action can be taken before the animals can stray.

Geoffrey Begg U.S. Pat. No. 4,523,187 describes a monitoring system for an electric fence which includes a voltmeter for sensing the voltage of the pulses on the fence and an ammeter for sensing the current level flowing through the fence wire. If the voltage drops significantly or the current level increases, a short circuit condition is detected. Likewise, if the current flow read by the ammeter drops to zero, an open circuit condition is indicated. The monitoring system of the Begg patent is physically disposed proximate the pulse generator used to energize the fence and is designed to give, by means of a meter reading, an indication of the voltage level at the far end of the fence. When the signal levels fall outside of a predetermined threshold setting, an audible alarm 18 is operated. The device of the Begg patent is deficient in that it does not provide an indication of the location along the fence line where the fault has occurred which, of course, makes troubleshooting the fence line more difficult.

The McCutchan et al. U.S. Pat. No. 4,297,633 describes an electric fence monitoring system in which a plurality of remotely located responders are operatively coupled to the electric fence for providing responses back to a receiver located at the site of the fence generator. If there is a break in the fence wire, the responder cannot, within a predetermined time interval, deliver its response signal upon receipt of a fence energizing pulse and, accordingly, an alarm is indicated at the receiver site.

Another fairly simple electric fence monitoring system is described in the Pope et al. U.S. Pat. No. 4,220,949. It includes a monitor circuit, including a relay, at the end of the fence opposite from the fence-charging circuit. In the event of a break, the relay switches its contacts to couple an alarm into circuit with a power supply. The device of the Pope et al. patent is incapable of indicating to the farmer or rancher the approximate location where the fault in the fence has occurred. Again, this compounds the effort in making appropriate repairs.

OBJECTS

It is accordingly a principal object of the present invention to provide an improved monitoring and indicating system for use with electrical appliances such as electric fences, ventilating fans, water pumps, portable generators, etc.

Another object of the invention is to provide an electric fence monitoring system which is capable of providing an indication of where along several miles of fencing a fault condition has developed.

Still another object of the invention is to provide an electric appliance monitoring and indicating system that provides a visual indication of a fault condition that can be seen from great distances.

A still further object of the invention is to provide a low-cost, yet highly effective appliance fence monitor-/indicator that will remain operational over prolonged periods of time when energized by a self-contained battery-type power supply.

SUMMARY OF THE INVENTION

In accordance with the present invention there is provided an apparatus for visually signaling the malfunctioning of an electric appliance. As applied to an electric fence, a plurality of monitoring devices are affixed to selected fence posts spaced considerable distances apart along the fence line for sensing when the amplitude of the high voltage pulses applied to the fence have fallen below a predetermined threshold. Also included is a xenon flash lamp circuit which is coupled to the above-described sensor and which provides an intense flash of light, visible at great distances, at predetermined intervals so long as the amplitude of the high voltage pulses used to energize the fence remain below the predetermined threshold. To conserve battery power, the xenon flash lamp circuit can be set to flash at a pre-established frequency and, similarly, the amount of charging current supplied to the storage capacitors associated with the xenon lamp is also a controllable parameter.

BRIEF DESCRIPTION OF THE DRAWINGS

The foregoing features, objects and advantages of the invention will become apparent to those skilled in the art from the following detailed description of the preferred embodiment, especially when considered in conjunction with the accompanying drawings in which like numerals in the several views refer to corresponding parts.

FIG. 1 illustrates a section of a fence line showing the apparatus of the present invention in place on one of the fence posts;

FIG. 2 is a side elevational view of the housing which is partially broken away to reveal the disposition of the electronic circuitry comprising the present invention;

FIG. 3 is a end view of the housing of FIG. 2 showing the window configuration;

DESCRIPTION OF THE PREFERRED EMBODIMENT

Referring first to FIG. 1, there is shown a section of an electric fence 10 with which the present invention finds use. It comprises a plurality of regularly spaced posts 12, and extending between the posts and attached thereto may be strands of barbed wire as at 14. Mounted on the posts 12 are a plurality of conventional insulating stand-offs 16 about which is strung a continuous length of wire 18.

The wire 18 is typically connected to the high voltage output of a fence generator (not shown) and the other output terminal of the fence generator is connected to ground, via a water pipe or other type of grounding stake.

With no limitation intended, the fence generator will typically produce high voltage pulses having an amplitude of 500 to 10,000 volts dc, a duration of from 150 microseconds to 16 milliseconds, and a pulse repetition rate of 1 Hz. As such, a farm animal coming in contact with the electric fence wire 18 and whose feet are in good electrical contact with the ground will receive an uncomfortable, but non-lethal shock.

Figure 4:
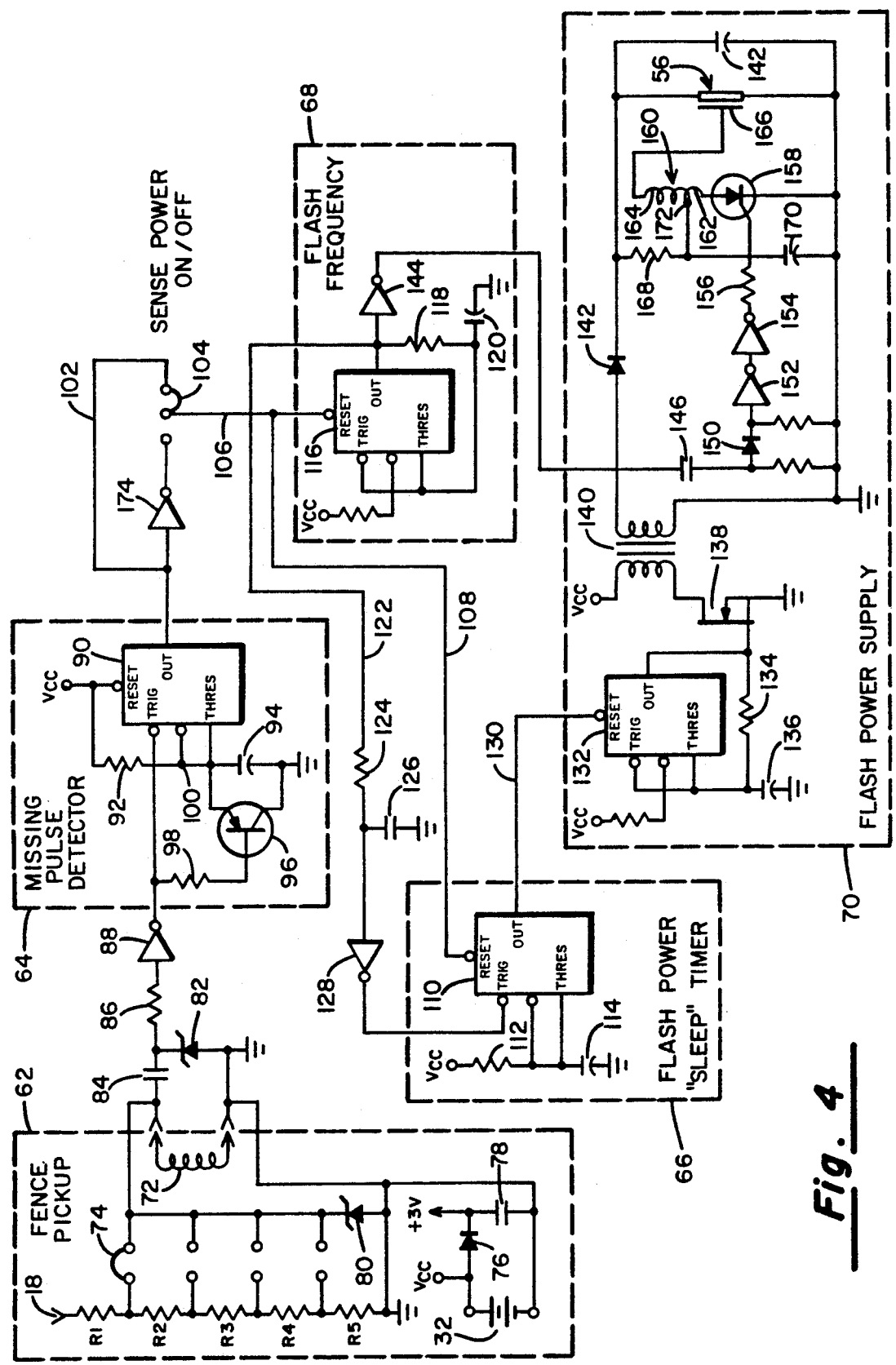
FIG. 4 is a schematic electrical diagram of the circuitry comprising the preferred embodiment of the present invention.

The monitoring and indicating device of the present invention is indicated generally by numeral 20 and is appropriately attached to one of the fence posts 12. It is directed so that the flash emanating therefrom is most likely to be seen. As will be explained in further detail when the schematic diagram of FIG. 4 is explained, the monitoring and indicating device 20 has one lead thereof 22 coupled or attached to the fence wire 18 and another lead thereof connected to ground. If a metal post 12 is employed, a good ground connection can be made directly to that post. However, if the posts 12 are of wood, it is usually necessary to ground the lead 24 using a metal grounding stake 26 or the like.

FIG. 2 illustrates in greater detail the mechanical construction of the preferred embodiment. It is seen to comprise a tubular housing 28 in which the electrical components are sealed from the elements. In constructing a prototype of the invention, I found it expedient to use a Tee fitting, made of PVC plastic normally used for plumbing purposes. The housing 28 has an integrally formed flange 30 and 32 at opposed ends, respectively, and fitted through the open end of the T-fitting is 6 volt lantern battery 32 having spring-type terminals 34 and 36. A threaded PVC plug 38 is designed to fit into the threaded flange 3 to thereby seal that end of the housing. The plug 38 may be removed whenever it becomes necessary to replace the battery 32.

Conveniently fitting into the stem portion 40 of the T-shaped housing is a storage capacitor 42 having terminals 44 and 46 which are connected by wires 48 and 50 to appropriate terminals on a printed circuit board 52. The pc board is appropriately supported within the housing and is populated with the various electronic components used in implementing the circuits shown schematically in FIG. 4. Also appropriately mounted within the housing 28 is a reflector 54 in which is supported a xenon flash lamp 56.

With reference to the end view of FIG. 3, an opaque plate 58 is disposed within the flange 32 and is sealed about the perimeter. It includes a transparent window 60 with which the flash tube 56 and the reflector 54 are optically aligned. When the xenon flash lamp 56 is excited, a bright flash of light, visible for miles, emanates the window 60.

Having described the mechanical construction of the preferred embodiment, consideration will next be given to its electrical makeup and, in this regard, reference is made now to FIG. 4. The circuit can conveniently be partitioned into a number of discrete functional units which are shown as being enclosed by broken line boxes. Specifically, the circuit comprises a fence pickup device 62, a missing pulse detector 64, a flash power "sleep" timer 66, a flash frequency setting circuit 68 and a flash power supply circuit 70.

Alternative ways are illustrated for implementing the fence pickup device 62. Specifically, it may be an inductive pickup in which a coil 72 is closely linked to the fence wire 18 (FIG. 1) so that as high voltage pulses traverse the fence wire, a voltage signal will be induced in the coil 72. Alternatively, and preferably, the fence pickup may comprise a resistive voltage divider including a plurality of series-connected resistors $R_1$ through $R_5$, that divider being connected between the fence line 18 and ground. Depending upon which set of contacts associated with the voltage divider are connected together by a jumper 74, the fence voltage threshold at which the device of the present invention will be triggered can be set. The six volt lantern battery 32 is used to provide two separate voltages for operating the circuit of the present invention. One voltage labeled $V_{cc}$ will be six volts, assuming the battery 32 is fully charged. A voltage dropping diode 76 and the capacitor 78 are used to provide a three volt source required by certain of the integrated circuits yet to be described. A zener diode 80 is used to eliminate high voltage spikes and other transient signals from damaging the electronic circuitry by providing a low impedance path to ground for such signals when the threshold of the zener diode 80 is exceeded. In a like fashion, the zener diode 82 performs the same function when an inductive pickup 72 is employed.

Irrespective of the type of pickup employed, the signal developed thereby is coupled through a capacitor 84 and a resistor 86 to the input of an invertor 88. The output of the invertor 88 goes to the missing pulse detector circuit 64. This missing pulse detector includes a Type LM 555 timer circuit 90 whose trigger input is connected directly to the output of the invertor 88. A RC charging circuit is connected between the $V_{cc}$ source and includes a resistor 92 and a capacitor 94. The capacitor 94 is shunted by a PNP transistor 96 whose base electrode is coupled through a resistor 98 to the output of the invertor 88. The threshold input terminal of the LM 555 timer circuit 90 is connected to the junction point 100 between the resistor 92 and the capacitor 94. Hence, as the capacitor 94 begins to charge through resistor 92, a point will be reached where the threshold will be exceeded, provided the charge on the capacitor is not shorted to ground through the transistor 96. It can be seen, then, that so long as the high voltage pulses on the fence are occurring at a predetermined rate, the threshold for the timer 90 will not be exceeded. However, if something should happen that fence pulses are missing or of an insufficient amplitude, the transistor 96 will not be turned on to short out the capacitor 94 and it will charge to the point where the threshold for the timing circuit is exceeded and the output of the timer circuit 90 shifts its binary state.

When operating in the monitoring mode, the output of the timer 90 is connected by means of conductor 102, a jumper 104, a conductor 106 and a conductor 108 to the reset input of a further LM 555 timer 110 configured to operate as a one shot. It comprises the flash power "sleep" timer 66. The period for the one-shot is established by the RC timing circuit including the resistor 112 and the capacitor 114. So long as the missing pulse detector circuit 64 is not detecting the absence of appropriate amplitude fence voltage pulses, the reset will be maintained on the one-shot 110. Likewise, the reset will be maintained on yet another LM 555 timer, this time configured as a multi-vibrator 116. It comprises the flash frequency circuit 68. The frequency of the output from the multi-vibrator 116 is determined by the magnitude of the resistor 118 and the capacitor 120. By properly choosing these values, the xenon lamp may be made to flash at 30-second intervals, one-minute intervals or any other frequency, it being recognized that if the flashing is too infrequent it may go unnoticed but that too frequent flashing consumes battery charge.

The output of the flash frequency multi-vibrator 116 is connected via conductor 122 and the differentiating circuit including resistor 124 and capacitor 126 to the input of an invertor 128. The output of this invertor is connected to the trigger input of the one-shot circuit 110 in the flash power sleep timer 66.

The output from the one-shot 110 is applied over conductor 130 to the reset input of still another LM 555 timer configured as a free-running oscillator 132 which forms part of the flash power supply 70. The frequency of oscillation of the output from the free-running oscillator 132 is determined by the RC timing circuit including resistor 134 and capacitor 136. The signal output of oscillator 132 is used to drive a FET switch 138 which is connected in series circuit with the primary winding of a step-up transformer 140 between the voltage source $V_{cc}$ and ground. Thus, the oscillator and FET switch function as a chopper for the dc voltage and creates an alternating current signal that can be stepped-up by the transformer 140. The secondary winding of the transformer 140 is connected in series with a half-wave rectifying diode 142 and the main storage capacitor 42 for the xenon flash lamp 56. Thus, a high voltage direct current becomes available for charging that capacitor.

The storage capacitor 42 is connected directly in parallel with the main power electrodes of the xenon flash lamp 56 but the charge stored on that capacitor cannot be dumped through the xenon flash lamp 56 to cause it to flash until the xenon gas is appropriately ionized.

From what has been thus far described, it should be readily apparent that the circuit 66 determines the length of time that the flash power supply is operative to charge the main storage capacitor 42. In this way, battery power is conserved. That is to say, charging current is not continuously provided to the main storage capacitor 42 but instead is only charged for a period of time determined by the circuit 66 and then, only when the missing pulse detector 64 is detecting a fault condition on the fence so as to actuate the flash frequency circuit 68.

The output from the flash frequency multi-vibrator 116 is applied through an invertor 144, a coupling capacitor 146, a diode 150 and a pair of buffer invertors 152 and 154 and a current limiting resistor 156 to the gate electrode of a silicon-controlled rectifier semi-conductor switching device 158. The SCR is coupled in series with a step-up auto-transformer 160 having a primary winding 162 and a secondary winding 164 series connected to the trigger electrode 166 of the xenon flash tube 56. A RC charging circuit including resistor 168 and capacitor 170 is connected to the common terminal 172 of the primary winding 162 and the secondary winding 164. Capacitor 170 becomes charged by the rectified alternating current developed across the secondary of the step-up transformer 140 and when the SCR 158 is turned on, the capacitor 170 discharges rapidly through the primary winding 162 of the auto-transformer 170 through the SCR 158 to ground. The rapid current surge through the primary winding 162 induces a high voltage onto the secondary winding 164 of the transformer and this voltage is sufficient to cause ionization of the xenon gas within the flash tube 56. Once the gas is ionized, it becomes a low impedance allowing the main storage capacitor 42 to dump its charge through the xenon flash tube, resulting in a brilliant, short flash of light being emitted therefrom. In daylight, the flash can be seen for a mile or more and at night for up to 6 miles.

Summarizing the operation of the circuit of FIG. 4, the Type 555 timer 90 in the missing pulse detector 64 is normally precluded from issuing an output on its "out" terminal so long as the charge on the capacitor 94 never reaches the threshold voltage for the timer. Capacitor 94 charges through resistor 92, but is discharged each time transistor 96 is turned on by the fence voltage pulses. If the fence voltage falls below the threshold voltage established by the jumper 74 on the voltage divider $R_2$ through $R_5$, transistor 96 will not turn on and, hence, the threshold voltage for the timer 90 will be exceeded as the charge builds up on capacitor 94.

When the timer 90 outputs a pulse, it triggers the one-shot 110 in the flash power "sleep" timer 66 and the period of that one-shot determines the charge time of the large storage capacitor 42. The period is determined by the RC timing circuit including resistor 112 and capacitor 114. In particular the output of the one-shot 110 enables the free-running oscillator 132 which switches the FET 138 on and Off to chop the battery current flowing in the primary of the step-up transformer 140. The resulting high AC voltage is half-wave rectified by the diode 142 and is applied to the main storage capacitor 42 and to the capacitor 170 through the resistor 168 to build up a charge thereon. When the one-shot 110 times out, the charging ceases.

Assuming that the sense power on/off jumper 104 is in its "off" position, such that the xenon lamp can flash when the fence power fails or falls below a threshold set by the input voltage divider, the output of the missing pulse detector 64 removes the reset from the free-running multi-vibrator 116 of the flash frequency circuit 68 and it produces trigger pulses which are applied, via diode 150 and the buffer invertors 152 and 154, to the gate electrode of the SCR 158. This causes capacitor 170 to discharge through the primary winding 162 of the step-up auto-transformer 160 to produce a voltage of approximately 5 KV across its secondary, that voltage being sufficient to trigger the xenon lamp 56. Once the gas in the lamp is ionized by that trigger input, it constitutes a low impedance path across the main storage capacitor 42 and it rapidly discharges through the xenon lamp, causing it to brilliantly flash.

When trouble-shooting a fence to see where the problem is, one can carry the device of FIG. 2 but with the sense-power on/off jumper reversed from that shown in FIG. 4 such that the output from the 555 timer is inverted by invertor 174 before being applied to the reset inputs of the one-shot 110 and the multi-vibrator 116. This will result in flashes being emitted when fence pulses are present rather than when absent. The user may walk along the fence line, periodically clipping the leads of the device between the fence wire and ground and so long as a flash is produced, the user will know that the fence is operational between the location of the fence energizing generator and the point at which the test is being made. If the unit fails to flash, it is known that a low impedance path, such as a tall wet grass, a broken branch or some similar object is contacting the fence ahead of the location at which the test is being made.

ALTERNATIVE EMBODIMENT

Figure 5:
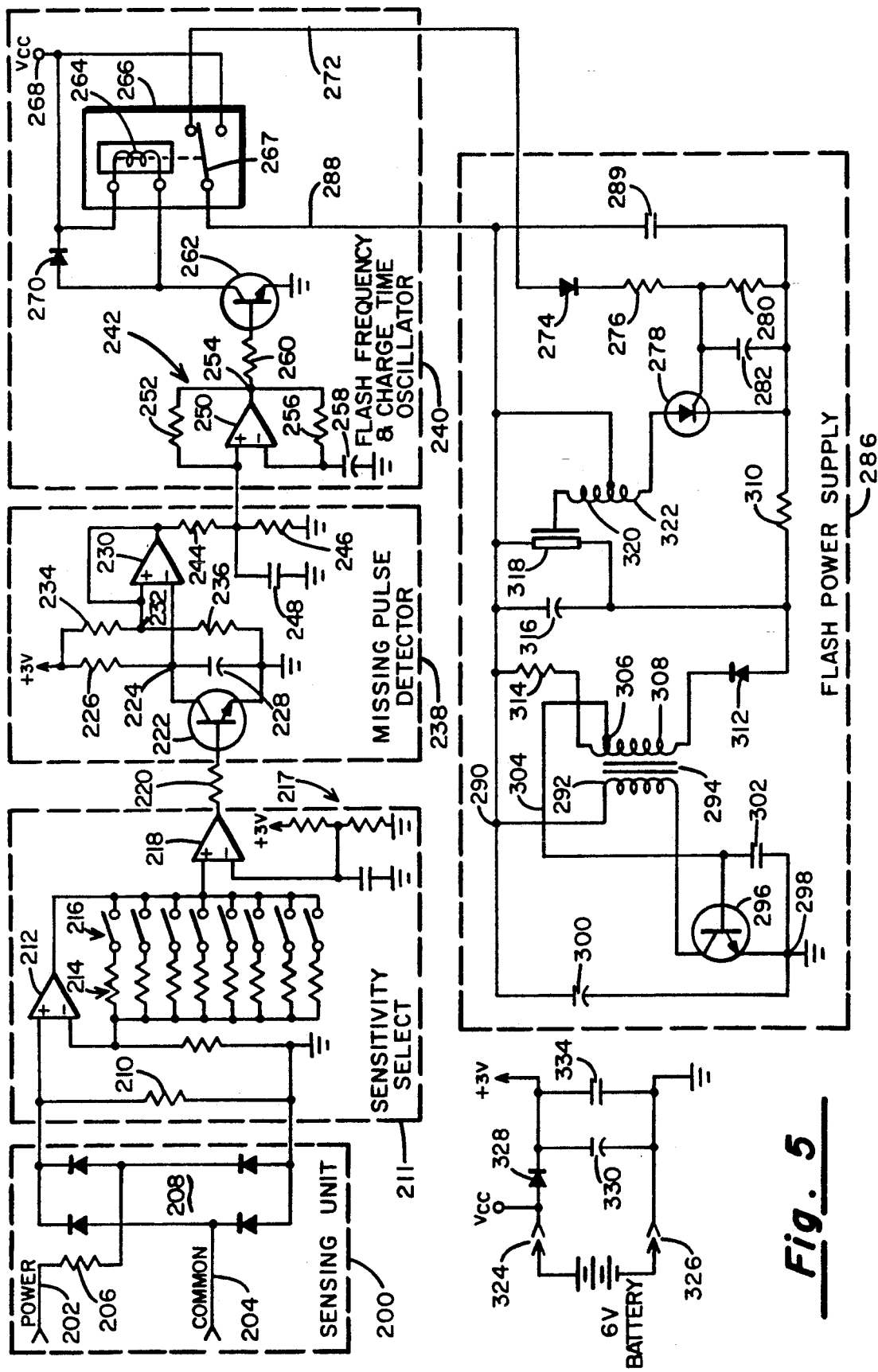
FIG. 5 is a schematic electrical diagram of an alternative embodiment of the invention.

FIG. 5 illustrates an alternative circuit arrangement for implementing the electric appliance fault monitor and indicating system of the present invention. While the first embodiment disclosed herein has been described in connection with the monitoring and indicating of faults in an electric fence at great distances, to illustrate the versatility of the present invention, the embodiment shown in FIG. 5 will be described as applied to monitoring the power to a 220 volt ventilating fan system commonly used in poultry barns to prevent over-heating of the animals. Failure of such ventilating fans without relatively prompt corrective action can result in the death of thousands of birds.

The power sense bridge shown enclosed by dash line box 200 allows the circuit of the embodiment of FIG. 5 to be used with either ac, dc+ or dc−voltages. In this application, the device of FIG. 2 is mounted on the exterior of the barn, preferably on its roof so that the flash produced can be observed from a considerable distance. The input voltage to be monitored is connected across the terminals 202 and 204 and through a resistor 206 to a first input of a full wave diode rectifier bridge 208. The common terminal 204 connects to the other power input terminal of that bridge. Irrespective of whether the applied voltage to the terminals 202 and 204 is dc or ac, a dc voltage will be developed across the load resistor 210. This voltage is also applied to the non-inverting input of an operational amplifier 212 which may, for example, be a Type LM 2902 integrated circuit having a feedback path including a plurality of gain adjusting resistors, one or more of which can be selected for insertion into the feedback path by operation of selected ones of the plural single-pole, single-throw switches 216. By appropriate selection of the feedback resistor, the device of the present invention can be made to operate with a power source ranging from, for example, 5,000 volts down to 100 volts. This, of course, adds to the versatility of the monitoring and indicating device.

The sensitivity select circuit 211 also includes an integrated circuit operational amplifier configured as a voltage comparator 218. The voltage developed at the output of the adjustable gain amplifier 212 is applied to the non-inverting input of the voltage comparator 218 while a reference potential of approximately 2.7 volts is applied to the inverting input thereof. So long as the power sensing bridge and sensitivity select circuit are detecting a voltage in excess of the value selected by operation of one or more of the switches 216, the output of the voltage comparator 218 will be high. This signal is coupled, via a resistor 220, to the base electrode of NPN transistor 222 whose emitter electrode is connected to ground and whose collector electrode is coupled to a junction point 224 between a resistor 226, a capacitor 228 and the non-inverting input of an operational amplifier 230. The inverting input of the amplifier 230 is connected to the common junction 232 between a pair of series connected resistors 234 and 236 which are themselves connected between a source of positive potential (+5 volts) and ground. So long as the voltage being monitored remains above the threshold level established, the NPN transistor 222 will remain conducting due to the high output from the voltage comparator 21B. With the transistor 222 conducting, the capacitor 228 connected between the transistors collector and emitter cannot become charged and the signal at the junction 224 remains low. If, however, the voltage being monitored falls below the prescribed level, the output from the voltage comparator 218 will go low, turning off the transistor 222 and permitting the capacitor 228 to charge up. When the charge on the capacitor causes the voltage at junction 224 to exceed the threshold applied to the inverting input of the operational amplifier 230, its output will go high. Thus, the circuitry shown enclosed by the broken line box 238 functions much like the missing pulse detector in the circuit of FIG. 4.

The flash frequency and charge time oscillator is shown enclosed by broken line box 240 and it includes a low frequency oscillator, indicated generally by numeral 242, whose duty cycle is established by the resistors 244 and 246 and the capacitor 248. The common junction between the series-connected resistors 244 and 246 is tied to the non-inverting input of an operational amplifier 250 having a feedback resistor 252 connected between its output junction 254 and the non-inverting input. Likewise, a resistor 256 is connected between the junction 254 and the inverting input of the amplifier 250. A capacitor 258 couples the inverting input to ground. The component values of the resistor 256 and the capacitor 258 determine the frequency of oscillation of the charge time oscillator. Typically, those values may be set so that the oscillator operates at a frequency of approximately one cycle per minute although it may be made to oscillate at a higher or lower rate by merely adjusting those components.

The output from the oscillator appearing at junction 254 is coupled through a resistor 260 to the base electrode of a further NPN transistor 262. The emitter electrode of that transistor is connected to ground and the coil 264 of a single-pole, double-throw relay 266 is connected between a source of positive potential, $V_{cc}$, at terminal 268 and the collector electrode of transistor 262. A half-wave diode rectifier 270 is connected in parallel with the relay coil 264.

The normally closed contact labeled "NC" is connected by a conductor 272, a diode 274 and a resistor 276 to the gate electrode of a SCR 278. The gate electrode is also coupled through a parallel combination of a resistor 280 and a capacitor 282 to a bus 284 in the flash power supply circuit shown enclosed by broken line box 286. The normally open contact of the relay 266 is coupled to the voltage supply 268 and when the switch ar 267 of that relay switches to the normally open position, that potential is applied, via conductor 288, to the flash power supply 286. In particular, the conductor 288 connects to a junction point 290 to which one terminal of the primary winding 292 of a step-up transformer 294 is connected. The other terminal of the primary winding is connected to the collector electrode of a NPN transistor 296 whose collector electrode is grounded at junction 298. A capacitor 300 is also connected between the junctions 290 and 298.

The base electrode of transistor 296 is connected by a capacitor 302 to ground and by a conductor 304 to a tap 306 on the secondary winding 308 of the step-up transformer 294. A resistor 310 and a diode 312 couple the bus 284 to one side of the secondary winding 308 while the other side of that winding is connected through a resistor 314 to the conductor 388. The main storage capacitor for the flash power supply 286 is identified by numeral 316 and it is connected directly in parallel with the terminals of a xenon flash lamp 318 and between the conductor 288 and the bus 284. The trigger terminal for the xenon lamp 318 is connected to an output terminal of a step-up transformer 320. The transformer 320 is configured as an autotransformer and its primary winding 322 is connected in series between the conductor 288 and the SCR 278 to the bus 284.

The voltage $V_{cc}$ is available from a six volt battery connected between the battery terminals 324 and 326. To provide the five volt supply voltage required for the integrated circuits employed, a diode 328 provides the voltage dropping function. The capacitors 330 and 334 which are connected in parallel between ground and the five volt supply provide temporary voltage to the threshold determining circuit 217 in the sensitivity select network 211 and to the missing pulse detector 238 during those time intervals when the main storage capacitor 316 for the xenon lamp 318 is being charged following a flash. The changing current places a heavy load on the battery, dropping its voltage, thus making it necessary to temporarily provide the necessary bias potentials from capacitors 330 and 334.

Having described the construction of the alternative embodiment of FIG. 5, consideration will next be given to its mode of operation. As mentioned previously, so long as the proper voltage for the appliance being monitored is being applied across the terminals 202 and 204, the output from the comparator 218 will be high, forcing a low signal at the output of the operational amplifier 230 in the missing pulse detector. This low signal prevents the oscillator 242 from oscillating causing a low signal to be applied to the base of the transistor 262. This low signal renders that transistor non-conducting and, hence, no power will be applied to the flash power supply circuit 286.

If now, however, the voltage for the appliance, here assumed to be a 220 volt motor-driven ventilating fan, the output of the voltage comparator 218 will go low turning the transistor 222 off. With transistor 222 non-conducting, a charging current flows through the capacitor 228 causing the voltage at junction 224 to rise asymptotically until the voltage applied to the non-inverting input of the operational amplifier 230 exceeds the threshold applied to its inverting input, via the voltage divider including resistors 234 and 236. When this happens, the output of circuit 230 goes high, as does the output from the oscillator 242 at junction 254. With the voltage at junction 254 high, transistor 262 is turn ®d on, thereby drawing an energizing current through the relay coil 264 from the supply connected at terminal 268. This action causes the switch arm 267 to move to the normally open contact "NO" such that the voltage $V_{cc}$ is applied over line 288 to the flash power supply 286. The approximately six volt dc voltage, applied via conductor 288, energizes the blocking oscillator including the transistor 296 and the step-up transformer 294, producing an approximately 300 volt potential across the secondary winding 308 of that transformer. That ac potential is half-wave rectified by the diode 312 and the resulting dc current is used to charge the main storage capacitor 316 for the xenon flash lamp 318.

The lamp does not flash at this time in that no trigger pulse is applied to the xenon lamp to create the necessary ionization potential for the xenon gas within the flash tube. When the oscillator 242 in the "flash frequency and charge time oscillator" circuit 240 again switches low, the transistor 262 will again be turned off, de-energizing the relay coil 264 and causing the switch arm 267 to again move to the normally closed, "NC", contact. This effectively connects the gate electrode of the SCR 278 to the bus 288, discharging the capacitor 289 through the diode 274 and the current limiting resistor 276 to thereby switch the SCR 278 to its conducting state. With SCR 278 conducting, a rush of current flows through the primary winding 322 thereof, causing a high voltage pulse to be generated across the secondary winding 320 triggering the flash tube 318. Once the gas in the flash tube 318 is ionized, it provides a low impedance path for a discharge of the main storage capacitor 316 producing the bright flash. So long as the fault condition prevails, the oscillator 242 will continue to cycle in the fashion already indicated with charging and flashing taking place on alternate half cycles its output.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. Apparatus for monitoring the voltage applied to an electrical appliance and for visually signalling a drop in said voltage below a predetermined acceptable threshold to a location remote from said appliance comprising, in combination:

(a) means electrically coupled to a voltage supply for said appliance for sensing when the amplitude of the voltage from said voltage supply has fallen below said predetermined acceptable threshold;

(b) a power source independent and electrically isolated from said appliance voltage supply; and (c) xenon flash lamp means operatively coupled to said means for sensing and to said independent power source for providing an intense flash of light visible at great distances at predetermined intervals, so long as the amplitude of the voltage of said voltage supply remains below said predetermined acceptable threshold.

2. Apparatus for visually signalling malfunctioning of an electric fence having posts, said electric fence being of the type in which at least one continuous length of fence wire is strung between post mounted insulators and is periodically energized by high voltage pulses generated by a fence voltage supply capable of administering a non-lethal shock to animals coming into contact therewith, the combination comprising:

(a) means affixed to ones of said posts at predetermined intervals along the fence line for sensing when the amplitude of said high voltage pulses has fallen below a predetermined acceptable threshold;

(b) a power source independent and electrically isolated from said fence voltage supply; and (c) xenon flash lamp means operatively coupled to said means for sensing and to said independent power source for providing an intense flash of light visible at great distances at predetermined intervals so long as the amplitude of said high voltage pulses remains below said predetermined acceptable threshold.

3. The apparatus as in claim 2 wherein said means for sensing comprises:

(a) inductive pick-up coil coupled to said fence wire;

(b) means coupled to said pick-up coil for detecting the absence of said high voltage pulses exceeding said predetermined threshold for a predetermined time interval and for producing a control signal indicative of such condition; and (c) means responsive to said control signal for triggering said xenon flash means.

4. The apparatus as in claim 2 wherein said means for sensing comprises:

(a) a resistive voltage divider having a plurality of series connected resistors of predetermined ohmic value having first and second terminals and a plurality of selectable taps therealong, said first terminal being connected to said fence wire and said second terminal being grounded, with one of said selectable taps establishing said predetermined threshold;

(b) means coupled to said one of said selectable taps for detecting the absence of said high voltage pulses exceeding said predetermined threshold for a predetermined time interval and for producing a control signal indicative of such condition; and (c) means responsive to said control signal for triggering said xenon flash means.

5. The apparatus as in claim 3 or 4 wherein said xenon flash lamp means comprises:

(a) a xenon flash lamp having a pair of input terminals and a control terminal;

(b) a storage capacitor connected to said pair of input terminals in parallel with said xenon flash lamp;

(c) battery operated means for developing a high dc voltage on said storage capacitor; and (d) means, including said means for triggering, responsive to said control signal for periodically applying an ionizing potential to said control terminal of said xenon flash lamp to thereby effect the discharge of said storage capacitor through said xenon flash lamp.

6. The apparatus as in claim 5 wherein said battery operated means comprises:

(a) a dc battery;

(b) a step-up transformer having a primary winding and a secondary winding;

(c) a semiconductor switching means connected in series with said dc battery and said primary winding and having a control terminal;

(d) current rectifying means connected in series with said secondary winding and said storage capacitor; and (e) oscillator means coupled to said control terminal of said semiconductor switching means for rendering said semiconductor switching means conductive and non-conductive at a predetermined frequency.

7. The apparatus as in claim 6 and further including means for enabling and disabling said oscillator means to thereby determine the charging time of said storage capacitor.

8. The apparatus as in claim 5 wherein said means for periodically applying an ionizing potential to said control terminal of said xenon flash lamp comprises:

(a) a free-running multi-vibrator for producing trigger pulses at a predetermined rate;

(b) means for applying said trigger pulses to said control terminal of said xenon flash lamp, said trigger pulse applying means being coupled to said means for sensing such that said trigger pulse applying means produces said trigger pulses only when the amplitude of said high voltage pulses on said fence wire are below said predetermined threshold for said predetermined time interval.

9. The apparatus as in claim 8 wherein said means for periodically applying an ionizing potential to said control terminal of said xenon flash lamp comprises:

(a) a step-up auto-transformer having a primary winding and a secondary winding;

(b) a silicon controlled rectifier having an input electrode, an output electrode and a gate electrode, said input and output electrode being connected in series with said primary winding and said secondary winding of said auto-transformer between said control terminal of said xenon flash lamp and a point of fixed potential;

(c) a series-connected resistor and capacitor connected between said battery-operated means and said point of fixed potential and having the common terminal of said series-connected resistor and capacitor connected to the common terminal of said primary winding and secondary winding of said auto-transformer; and (d) means coupling the gate electrode of said silicon controlled rectifier to receive said trigger pulses from said free-running multi-vibrator.

10. The apparatus as in claim 2 and further including a sealed housing adapted for connection to one of said posts for containing said sensing means and said xenon flash lamp means, said housing including a transparent window optically aligned with said xenon flash lamp for permitting the transmission of light beyond said housing while shielding said apparatus from the elements.

11. The apparatus as in claim 5 and further including a sealed housing adapted for connection to at least one of said posts for containing said xenon flash lamp, said storage capacitor, said battery-operated means and said means for applying said ionizing potential, said housing including a transparent window optically aligned with said xenon flash lamp for permitting the transmission of light beyond said housing while shielding the contents from the elements.

12. The apparatus as in claim 1 wherein said appliance is an electric fence.

13. The apparatus as in claim 1 wherein said appliance is an electric motor.

14. The apparatus as in claim 1 wherein said sensing means comprises:
(a) a full-wave bridge rectifier having a pair of input terminals for coupling said full-wave bridge rectifier to said voltage supply and a pair of output terminals;
(b) adjustable gain amplifier means for setting the sensitivity of said sensing means coupled to said pair of output terminals; and
(c) comparator means for comparing the output from said amplifier means to a predetermined threshold reference potential.

15. The apparatus as in claim 14 wherein said sensing means further includes:
(a) timing means coupled to receive the output of said comparator means for providing a control signal when said output of said comparator means remains below said threshold reference potential for a predetermined time interval.

16. The apparatus as in claim 15 and further including:
(a) flash frequency and charge time circuit means controlled by said control signal for repetitively charging and discharging said xenon flash lamp means.

* * * * *